(12) United States Patent
Hong et al.

(10) Patent No.: US 10,179,833 B2
(45) Date of Patent: Jan. 15, 2019

(54) OLIGOMER, COMPOSITION AND COMPOSITE MATERIAL EMPLOYING THE SAME

(71) Applicant: INDUSTRIAL TECHNOLOGY RESEARCH INSTITUTE, Hsinchu (TW)

(72) Inventors: Ming-Tsung Hong, New Taipei (TW); Yun-Ching Lee, Ji'an Township (TW); Wei-Ta Yang, Taoyuan (TW); Meng-Song Yin, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 225 days.

(21) Appl. No.: 15/395,599

(22) Filed: Dec. 30, 2016

(65) Prior Publication Data
US 2017/0342200 A1  Nov. 30, 2017

Related U.S. Application Data

(60) Provisional application No. 62/340,686, filed on May 24, 2016.

(51) Int. Cl.
*C03C 25/30* (2018.01)
*C03C 25/32* (2018.01)
(Continued)

(52) U.S. Cl.
CPC .............. *C08G 61/02* (2013.01); *C03C 25/30* (2013.01); *C03C 25/32* (2013.01); *C08F 32/08* (2013.01);
(Continued)

(58) Field of Classification Search
CPC ...... C08F 232/08; C08F 36/20; C08F 236/20; H05K 1/0306; H05K 1/09; H05K 1/0313;
(Continued)

(56) References Cited

U.S. PATENT DOCUMENTS 5,571,881 A    11/1996   Goodall et al.
5,741,869 A     4/1998   Goodall et al.
(Continued)

FOREIGN PATENT DOCUMENTS

CN    1135225 A    11/1996
CN    1229094 A     9/1999
(Continued)

OTHER PUBLICATIONS

Taiwanese Office Action for Appl. No. 105144141 dated Apr. 19, 2017.
(Continued)

*Primary Examiner* — Kregg T Brooks
(74) *Attorney, Agent, or Firm* — Birch, Stewart, Kolasch & Birch, LLP

(57) ABSTRACT

An oligomer, composition, and composite material employing the same are provided. The oligomer can be a reaction product of a reactant (a) and a reactant (b). The reactant (a) is a reaction product of a reactant (c) and a reactant (d). The reactant (b) can be

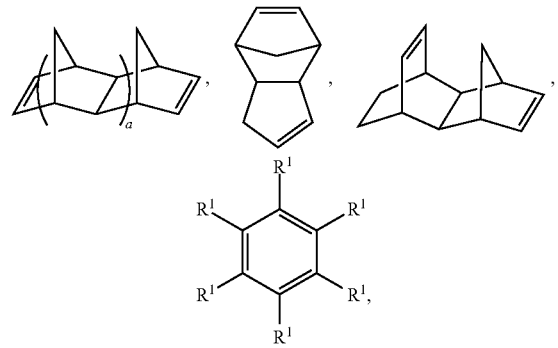

or a combination thereof, wherein a is 0 or 1, and $R^1$ is independently hydrogen or

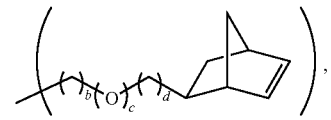

and wherein b is 0-6; c is 0 or 1; and, d is 0-6. The reactant (c) is

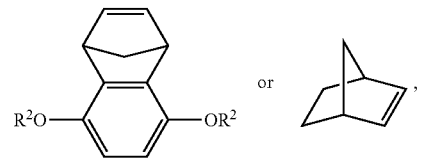

wherein $R^2$ is $C_{5-10}$ alkyl group. The reactant (d) is

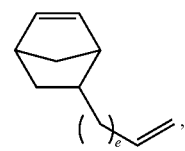

wherein e is 0-10.

19 Claims, No Drawings

(51) Int. Cl.

| | |
|---|---|
| C08G 61/08 | (2006.01) |
| C08G 61/12 | (2006.01) |
| C08L 25/10 | (2006.01) |
| C08L 65/00 | (2006.01) |
| C08L 45/00 | (2006.01) |
| C08L 47/00 | (2006.01) |
| H05K 1/03 | (2006.01) |
| C08J 5/24 | (2006.01) |
| C08F 36/20 | (2006.01) |
| C08F 32/08 | (2006.01) |
| C08F 232/08 | (2006.01) |
| C08G 61/02 | (2006.01) |
| C09D 171/12 | (2006.01) |
| H05K 1/09 | (2006.01) |
| C08J 5/04 | (2006.01) |
| C09D 125/10 | (2006.01) |
| H05K 1/02 | (2006.01) |

(52) U.S. Cl.
CPC ............ *C08F 36/20* (2013.01); *C08F 232/08* (2013.01); *C08G 61/08* (2013.01); *C08G 61/12* (2013.01); *C08J 5/04* (2013.01); *C08J 5/24* (2013.01); *C08L 25/10* (2013.01); *C08L 45/00* (2013.01); *C08L 47/00* (2013.01); *C08L 65/00* (2013.01); *C09D 125/10* (2013.01); *C09D 171/12* (2013.01); *H05K 1/0306* (2013.01); *H05K 1/0313* (2013.01); *H05K 1/09* (2013.01); *C08G 2261/122* (2013.01); *C08G 2261/135* (2013.01); *C08G 2261/1414* (2013.01); *C08G 2261/224* (2013.01); *C08G 2261/226* (2013.01); *C08G 2261/228* (2013.01); *C08G 2261/3324* (2013.01); *C08G 2261/3327* (2013.01); *C08G 2261/418* (2013.01); *C08G 2261/64* (2013.01); *C08G 2261/65* (2013.01); *C08G 2261/76* (2013.01); *C08J 2345/00* (2013.01); *C08J 2365/00* (2013.01); *C08J 2371/12* (2013.01); *C08J 2453/02* (2013.01); *C08J 2465/00* (2013.01); *C08L 2203/20* (2013.01); *H05K 1/024* (2013.01); *H05K 1/0326* (2013.01)

(58) Field of Classification Search
CPC ......... H05K 1/024; H05K 1/0326; C08J 5/24; C08J 2345/00; C08J 2347/00; C08J 2365/00; C03C 25/30; C08G 2261/76; C08G 2261/65; C08G 2261/122; C08G 2261/418; C08G 2261/1414; C08G 2261/3324; C08G 2261/3325; C08G 61/02–61/12; C08L 45/00; C08L 47/00; C08L 65/00; C09D 145/00; C09D 147/00; C09D 165/00; C09J 145/00; C09J 147/00; C09J 165/00
See application file for complete search history.

(56) References Cited

U.S. PATENT DOCUMENTS

| | | |
|---|---|---|
| 6,239,187 B1 | 5/2001 | Hatke et al. |
| 6,294,616 B1 * | 9/2001 | Rhodes ................ C08F 232/08 525/332.1 |
| 6,492,443 B1 | 12/2002 | Kodemura et al. |
| 7,122,611 B2 | 10/2006 | Lipian |
| 7,148,302 B2 | 12/2006 | Lipian |
| 7,291,689 B1 | 11/2007 | Lee et al. |
| 8,609,005 B2 | 12/2013 | Takeyama et al. |
| 2007/0255031 A1 | 11/2007 | Lee et al. |
| 2010/0063226 A1 | 3/2010 | Cho et al. |
| 2011/0021731 A1 * | 1/2011 | Hirata .................... C08G 61/08 526/281 |

FOREIGN PATENT DOCUMENTS

| | | |
|---|---|---|
| CN | 103232562 B | 8/2015 |
| JP | 3971476 B2 | 9/2007 |
| JP | 3978832 B2 | 9/2007 |
| JP | 2015-100984 A | 6/2015 |

OTHER PUBLICATIONS

Janiak et al., "The Vinyl Homopolymerization of Norbornene," Macromolecular Rapid Communications, 2001, vol. 22. No. 7, pp. 479-492.
Martin et al., "Development of a Low-Dielectric-Constant Polymer for the Fabrication of Integrated Circuit Interconnect," Advanced Materials, vol. 12, No. 23, Dec. 1, 2000, pp. 1769-1778.

* cited by examiner

OLIGOMER, COMPOSITION AND COMPOSITE MATERIAL EMPLOYING THE SAME

CROSS REFERENCE TO RELATED APPLICATIONS

This application claims the benefit of U.S. Provisional Application No. 62/340,686, filed on May 24, 2016, which is incorporated herein by reference.

TECHNICAL FIELD

The disclosure relates to an oligomer, a composition and a composite material employing the same.

BACKGROUND

The trend in electronic products has been toward smaller sizes, lighter weights, higher speeds, and higher-frequency transmission. Therefore, the trend is toward high-density printed circuit boards. In order to maintain transmission rate and transmission signal integrity, the ideal materials for use in printed circuit boards have a low dielectric constant (dielectric constant, Dk) and a low dissipation factor (dissipation factor, Df).

In general, conventional materials used to make printed circuit boards have a high dielectric constant (dielectric constant, Dk) and a high dissipation factor (dissipation factor, Df). Accordingly, a novel material for printed circuit boards is desired in order to improve the performance and reduce the Dk and Df of the via filling materials.

SUMMARY

According to an embodiment of the disclosure, the disclosure provides an oligomer. The oligomer can be a reaction product of a reactant (a) and a reactant (b), wherein the oligomer can have a number average molecular weight from 1,000 to 10,000; the reactant (a) can be a reaction product of a reactant (c) and a reactant (d); the reactant (b) can be a compound having a structure represented by Formula (I), a compound having a structure represented by Formula (II), a compound having a structure represented by Formula (III), a compound having a structure represented by Formula (IV), or a combination thereof Formula (I)

Formula (II)

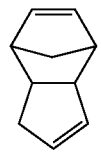

Formula (III)

Formula (IV)

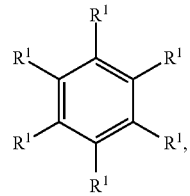

wherein a can be 0 or 1, and, $R^1$ is independently hydrogen or

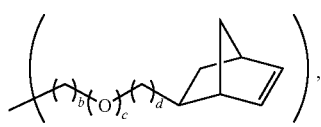

wherein, b can be 0 or an integer from 1 to 6; c can be 0 or 1; d can be 0 or an integer from 1 to 6, and at least one of $R^1$ is not hydrogen; and the reactant (c) is a compound having a structure represented by Formula (V), a compound having a structure represented by Formula (VI), or a combination thereof.

Formula (V)

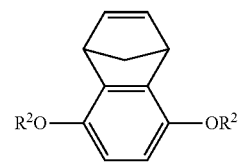

Formula (VI)

wherein $R^2$ is independently $C_{5-10}$ alkyl group, and the reactant (d) is a compound having a structure represented by Formula (VII)

Formula (VII)

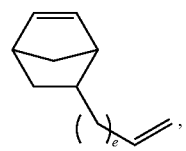

wherein e is 0 or an integer from 1 to 10.

According to an embodiment of the disclosure, the disclosure also provides a composition including: 100 parts by weight of the aforementioned oligomer; and 20-110 parts by weight of a crosslinking agent.

According to an embodiment of the disclosure, the disclosure also provides a composite material including a cured product or a semi-cured product prepared from the aforementioned composition; and a substrate, wherein the cured product or the semi-cured product is disposed on the substrate or disposed within the substrate.

A detailed description is given in the following embodiments with reference to the accompanying drawings.

DETAILED DESCRIPTION

Embodiments of the disclosure provide an oligomer, a composition, and a composite material employing the same. According to embodiments of the disclosure, the oligomer can be a reaction (such as addition polymerization) product of a reactant (a) and a reactant (b) (such as a compound having two or more than two olefinic functional groups which can undergo addition reaction). According to embodiments of the disclosure, the oligomer can be prepared from cyclic olefinic compounds via addition reaction, and the oligomer can have a branched structure. According to embodiments of the disclosure, the number average molecular weight (such as between 1,000 and 10,000) of the oligomer can be controlled by the composition and ratio of the reactants. According to embodiments of the disclosure, due to the high thermal stability and high solubility in organic solvent, the oligomer exhibits high processability. According to embodiments of the disclosure, the oligomer exhibits increased compatibility with the conventional resin serving as materials of printed circuit board. Therefore, when forming a composition by mixing the oligomer and the aforementioned resin, a phase separation is very low or not observed. According to embodiments of the disclosure, due to the low polarity and the crosslinkable functional groups of the chemical structure of the oligomer, the oligomer can enhance the mechanical strength of the substrate material, when using the oligomer as a reactant for preparing the substrate material. Embodiments of the disclosure also provide a composition including the aforementioned oligomer and a composite material (such as a prepreg) including a cured product or a semi-cured product prepared from the composition. The cured product of the composition of the disclosure exhibits a relatively low dielectric constant (Dk) and a relatively low dissipation factor (Df), and can serve as the material of high frequency substrate in order to improve insertion loss.

According to embodiments of the disclosure, the oligomer can be a reaction (such as addition polymerization) product of a reactant (a) and a reactant (b). According to embodiments of the disclosure, the oligomer can have a number average molecular weight from about 1,000 to 10,000, such as from about 1,000 to 9,000, from about 1,000 to 8,000, from about 1,000 to 7,000, from about 1,000 to 6,000, from about 1,000 to 5,000, from about 1,000 to 4,000, from about 1,000 to 3,000, or from about 1,000 to 2,500. As a result, the obtained oligomer can exhibit high solubility in organic solvent and increased processability. The reactant (b) can be a compound having a structure represented by Formula (I), a compound having a structure represented by Formula (II), a compound having a structure represented by Formula (III), a compound having a structure represented by Formula (IV), or a combination thereof

Formula (I)

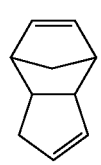

Formula (II)

Formula (III)

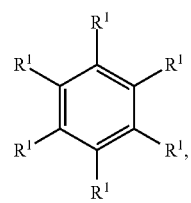

Formula (IV)

wherein a can be 0 or 1, and, $R^1$ can be independently H, or

wherein, b can be 0 or an integer from 1 to 6 (such as 1, 2, 3, 4, 5, or 6), c can be 0 or 1, d can be 0 or an integer from 1 to 6 (such as 1, 2, 3, 4, 5, or 6). For example, $R^1$ can be

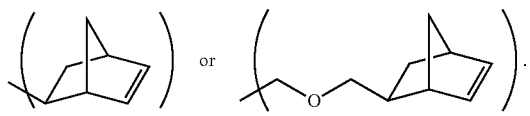

According to an embodiment of the disclosure, at least one $R^1$ cannot be hydrogen when the reactant (b) is a compound having a structure represented by Formula (IV).

According to an embodiment of the disclosure, the reactant (b) can be

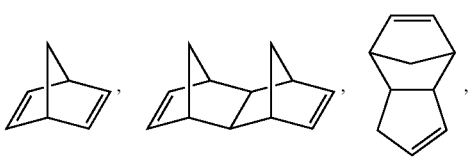

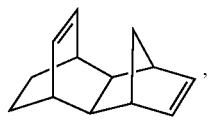

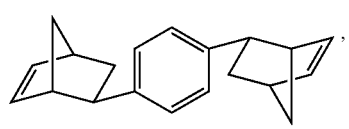

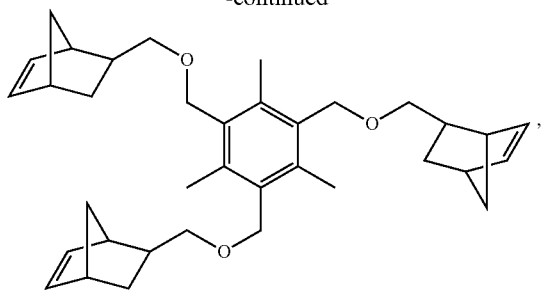

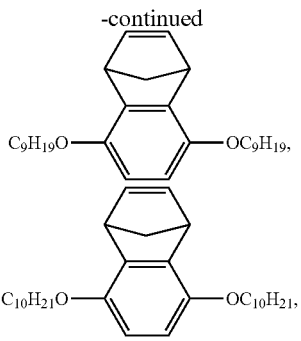

or a combination thereof.

According to an embodiment of the disclosure, the reactant (a) can be a reaction (such as addition polymerization) product of a reactant (c) and a reactant (d). In particular, the reactant (c) can be a compound having a structure represented by Formula (V), a compound having a structure represented by Formula (VI), or a combination thereof Formula (V)

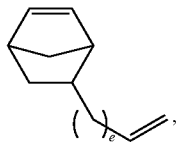

Formula (VI)

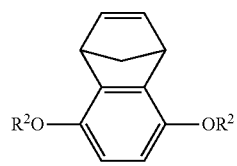

wherein $R^2$ can be independently $C_{5-10}$ alkyl group. For example, $R^2$ can be independently a linear or branched alkyl group, such as a linear or branched alkyl group having 5, 6, 7, 8, 9, or 10 carbon atoms. According to some embodiments of the disclosure, the reactant (c) can be

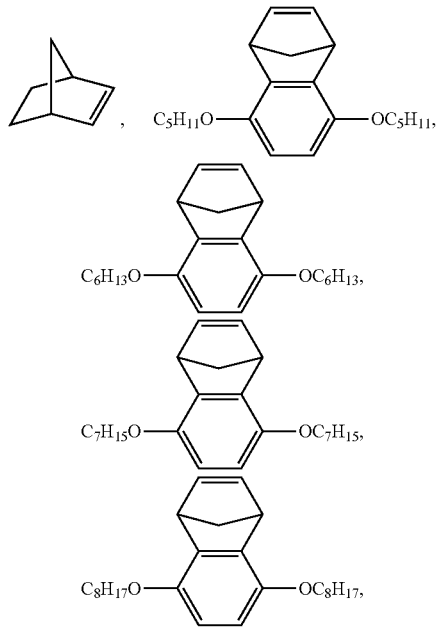

or a combination thereof. The reactant (d) can be at least one compound having a structure represented by Formula (VII)

Formula (VII)

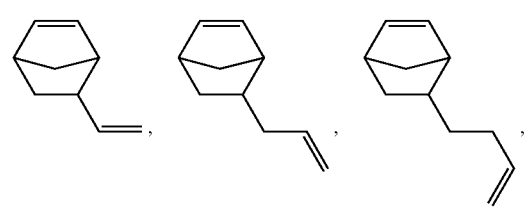

wherein e is 0 or an integer from 1 to 10, such as 1, 2, 3, 4, 5, 6, 7, 8, 9, or 10. According to some embodiments of the disclosure, the reactant (d) can be

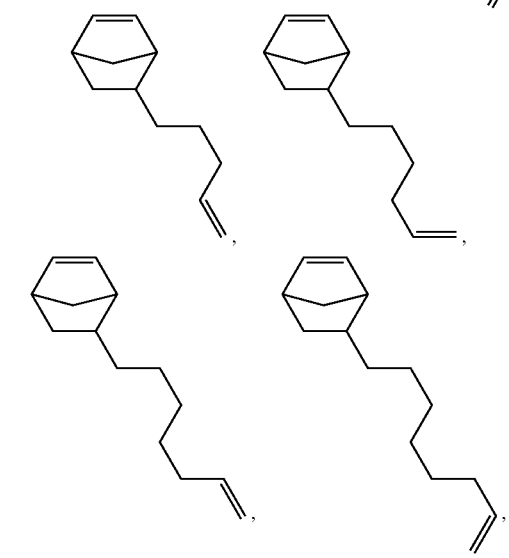

or a combination thereof.

According to an embodiment of the disclosure, the weight ratio of the reactant (c) to the reactant (d) can be from about 1:10 to 10:1, such as from about 1:10 to 5:1, from about 1:10 to 3:1, from about 1:10 to 1:1, from about 1:5 to 5:1, from about 1:5 to 3:1, or from about 1:5 to 1:1. When the weight ratio of the reactant (c) to the reactant (d) is too low, the oligomer would have a relatively low molecular weight and a relatively low yield. When the weight ratio of the reactant (c) to the reactant (d) is too high, the oligomer would have a relatively high molecular weight so that the oligomer has a poor solubility and a poor processability.

According to an embodiment of the disclosure, the weight ratio of the reactant (c) to the reactant (d) can be from about 1:10 to 1:1. As a result, the oligomer exhibits a high solubility in organic solvent, and a composition including the oligomer is more suitable for the subsequent process which includes coating the composition on a substrate or immersing a substrate into the composition.

According to an embodiment of the disclosure, the weight ratio of the reactant (c) to the reactant (b) can be from about 1:1 to 20:1, such as from about 1:1 to 15:1, from about 1:1 to 10:1, from about 1:1 to 9:1, from about 3:1 to 15:1, from about 3:1 to 10:1, or from about 3:1 to 9:1. When the weight ratio of the reactant (c) to the reactant (b) is too low, the oligomer would not have a branched structure. When the weight ratio of the reactant (c) to the reactant (b) is too high, the oligomer would have a relatively high molecular weight so that the oligomer has a poor solubility and a poor processability.

According to an embodiment of the disclosure, when the weight ratio of the reactant (c) to the reactant (d) is from about 1:10 to 1:1 (such as from about 1:5 to 1:1) and/or the weight ratio of the reactant (c) to the reactant (b) is from about 1:1 to 10:1 (such as from about 3:1 to 10:1), the oligomer can be completely dissolved in toluene having substantially the same weight of the oligomer at room temperature. According to an embodiment of the disclosure, the properties of the cured product of the composition (including the oligomer of the disclosure and a crosslinking agent) can be adjusted by modifying the ratio between the reactant (b), the reactant (c), and the reactant (d). For example, the cured product of the composition can exhibit relatively low dielectric constant (Dk) and relatively low dissipation factor (Df).

According to an embodiment of the disclosure, the method for preparing the aforementioned oligomer can include following steps. First, the reactant (c) is reacted with the reactant (d) for a first period of time to form the reactant (a) (a reaction product of the reactant (c) and the reactant via an addition reaction). Next, the reactant (b) is provided to react with the reactant (a) (such as addition reaction) for a second period of time. According to an embodiment of the disclosure, the method for preparing the aforementioned oligomer can include following steps. First, the reactant (c) is reacted with the reactant (d) in the presence of a catalyst composition for a first period of time to form the reactant (a) (a reaction product of the reactant (c) and the reactant (d) via an addition reaction). Next, the reactant (b) is reacted with the reactant (a) to undergo an addition reaction for a second period of time. In particular, the first period of time can be from about several minutes to 48 hrs (such as from about 30 mins to 10 hrs or from about 1 hr to 8 hrs); and the second period of time can be from about 24 hrs to 72 hrs. The molecular weight of the reactant (a) can be adjusted by means of the first period of time, thereby adjusting the molecular weight of the oligomer. In addition, the molecular weight of the oligomer can be adjusted by means of the second period of time.

According to an embodiment of the disclosure, the catalyst composition can include an addition polymerization catalyst, such as titanium-containing catalyst, zirconium-containing catalyst, palladium-containing catalyst, aluminum-containing catalyst, or a combination thereof. In addition, the catalyst composition can further a cocatalyst, a chain transfer agent, or a combination thereof. According to an embodiment of the disclosure, the use of the addition polymerization catalysts, cocatalysts, and chain transfer agents are not limited and include addition polymerization catalysts, cocatalysts, and chain transfer agents which are used in cyclic olefin addition polymerization, as known by those skilled in the art.

According to an embodiment of the disclosure, the disclosure also provides a composition including 100 parts by weight of the aforementioned oligomer, and about 20-110 parts by weight of crosslinking agent (such as about 20-100 parts by weight of crosslinking agent, about 30-100 parts by weight of crosslinking agent, or about 40-100 parts by weight of crosslinking agent). The crosslinking agent can be a small-molecule-type crosslinking agent, an oligomer-type crosslinking agent, polymer-type crosslinking agent, or a combination thereof For example, the crosslinking agent can be ethylene glycol dimethacrylate (EGDMA), 1,4-butanediol diacrylate, triallyl cyanurate, triallyl isocyanurate (TRIC), trimethallyl isocyanurate (TMAIC), butyl acrylate, 2-hydroxyethyl acrylate, diallyl phthalate, diallyl isophthalate, diallyl terephthalate, hydroxypropyl acrylate, 2-hydroxyethyl methacrylate, hydrolyzed polymaleic anhydride, 1,2,4-triallyl trimellitate, divinylbenzene, or a combination thereof.

According to an embodiment of the disclosure, the composition of the disclosure can further include 20-200 parts by weight of resin (such as about 20-180 parts by weight of resin, about 20-160 parts by weight of resin, 20-100 parts by weight of resin, or about 40-200 parts by weight of resin). The resin can be a conventional resin serving as materials of printed circuit board, and the compatibility between the oligomer of the disclosure and the resin is great. Therefore, a phase separation is not observed when mixing the oligomer of the disclosure and the resin to form the composition. For example, the resin can be epoxy resin, cyanate resin, phenol resin, novolac resin, polystyrene resin, styrene-butadiene copolymer resin, polyamide resin, polyimide resin, maleimide, bismaleimide, polyphenylene ether resin, or a combination thereof.

According to an embodiment of the disclosure, the composition of the disclosure can further include 1-30 parts by weight of additive (such as about 1-25 parts by weight of additive, or about 1-20 parts by weight of additive), wherein the additive can be an initiator, a hardener, a leveling agent, a filler, a colorant, a defoamer, a flame retardant, or a combination thereof.

According to an embodiment of the disclosure, the initiator can be peroxide initiator, such as benzoyl peroxide, 1,1-bis(tert-butylperoxy)cyclohexane, 2,5-bis(tert-butylperoxy)-2,5-dimethylcyclohexane, 2,5-bis(tert-butylperoxy)-2,5-dimethyl-3-cyclohexyne, bis(1-(tert-butylperoxy)-1-methy-ethyl)benzene), tert-butyl hydroperoxide, tert-butyl peroxide, tert-butyl peroxybenzoate, cumene hydroperoxide, cyclohexanone peroxide, dicumyl peroxide, lauroyl peroxide, or a combination thereof.

According to an embodiment of the disclosure, the hardener can be adjusted according to the selected resin and can be imidazole compound, such as 2-undecylimidazole, 2-heptadecylimidazole, 2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecyl imidazolium trimeritate, 1-cyanoethyl-2-phenyl imidazolium trimeritate, 2-phenyl-4,5-dihydroxymethylimidazole, 2-phenyl-4-methyl-5-dihydroxymethylimidazole, or a combination thereof.

According to an embodiment of the disclosure, the flame retardant can be bromine-containing or phosphorous-containing flame retardant, and the filler can be organic powder or inorganic powder, such as $Al(OH)_3$, $Al_2O_3$, $Mg(OH)_2$, $MnO_2$, $SiO_2$, or polyamide powder.

According to an embodiment of the disclosure, since the composition of the disclosure includes the aforementioned oligomer, the cured product of the composition exhibits a relatively low dielectric constant (Dk) and a relatively low dissipation factor (Df), and is suitable for serving as the material of high frequency substrate.

According to an embodiment of the disclosure, the disclosure also provides a composite material. The composite material can include the aforementioned a cured product or a semi-cured product of the composition, and a substrate. In particular, the cured product or semi-cured product is disposed on the substrate or within the substrate. According to an embodiment of the disclosure, the substrate can be a glass fiber, or a copper foil. For example, the composite material can include a prepreg, and the method for preparing the prepreg includes immersing a glass fiber (serving as the substrate) into the aforementioned composition. Next, the composition is subjected to a semi-curing process, obtaining the prepreg. In addition, the composite material can further include a copper foil, and the composite material can be a copper foil substrate, or a printed circuit board.

The inventive concept of the disclosure may be embodied in various forms without being limited to the exemplary embodiments set forth herein.

PREPARATION OF OLIGOMER

Example 1

First, 18 g of norbornene (191.18 mmol) (serving as the reactant (c)), 18 g of vinyl norbornene (146.76 mmol) (serving as the reactant (d)), and 150 ml of dichloromethane ($CH_2Cl_2$) were mixed, obtaining a first solution. Next, 0.6 g of bis(propanenitrile) dichloropalladium (II), 0.312 ml of propanenitrile, and 150 ml of dichloromethane ($CH_2Cl_2$) were added into a reaction bottle under nitrogen atmosphere. After stirring, 1.3 g of $AgSbF_6$ was added into a reaction bottle. Next, after stirring for 30 min, the first solution was added into the reaction bottle. After stirring for 2 hr, 2 g of norbornadiene (21.71 mmol) (serving as the reactant (b)) was added into the reaction bottle. Next, after stirring for 48 hr, the result was purified, recrystalized, and filtered, and the precipitate was collected. After drying the precipitate at 60° C., the result was collected, obtaining Oligomer (1). The branching ratio of Oligomer (1) determined by SEC/MALS/VIS method was about 73%, and it means Oligomer (1) having a branched structure. Next, the number average molecular weight (Mn) and the polydispersity index (PDI) of Oligomer (1) were determined, and the results are shown in Table 1.

Example 2

Example 2 was performed in the same manner as Example 1 except that the amount of norbornene was reduced from 18 g to 9 g, obtaining Oligomer (2). Next, the number average molecular weight (Mn) and the polydispersity index (PDI) of Oligomer (2) were determined, and the results are shown in Table 1.

Example 3

Example 3 was performed in the same manner as Example 1 except that the amount of norbornene was increased from 18 g to 24 g, obtaining Oligomer (3). Next, the number average molecular weight (Mn) and the polydispersity index (PDI) of Oligomer (3) were determined, and the results are shown in Table 1.

Example 4

Example 4 was performed in the same manner as Example 1 except that the amount of norbornene was reduced from 18 g to 12 g and the amount of vinyl norbornene was increased from 18 g to 24 g, obtaining Oligomer (4). The branching ratio of Oligomer (4) determined by SEC/MALSNIS method was about 68%. Next, the number average molecular weight (Mn) and the polydispersity index (PDI) of Oligomer (4) were determined, and the results are shown in Table 1.

Example 5

Example 5 was performed in the same manner as Example 1 except that the amount of norbornene was reduced from 18 g to 9 g and the amount of vinyl norbornene was increased from 18 g to 27 g, obtaining Oligomer (5). Next, the number average molecular weight (Mn) and the polydispersity index (PDI) of Oligomer (5) were determined, and the results are shown in Table 1.

Example 6

Example 6 was performed in the same manner as Example 1 except that the amount of norbornene was reduced from 18 g to 7.2 g and the amount of vinyl norbornene was increased from 18 g to 28.8 g, obtaining Oligomer (6). Next, the number average molecular weight (Mn) and the polydispersity index (PDI) of Oligomer (6) were determined, and the results are shown in Table 1.

Example 7

Example 7 was performed in the same manner as Example 1 except that the amount of norbornene was reduced from 18 g to 6 g and the amount of vinyl norbornene was increased from 18 g to 30 g, obtaining Oligomer (7). Next, the number average molecular weight (Mn) and the polydispersity index (PDI) of Oligomer (7) were determined, and the results are shown in Table 1.

Example 8

Example 8 was performed in the same manner as Example 1 except that norbornadiene was replaced with dicyclopentadiene, obtaining Oligomer (8). Next, the number average molecular weight (Mn) and the polydispersity index (PDI) of Oligomer (8) were determined, and the results are shown in Table 1.

Example 9

Example 9 was performed in the same manner as Example 1 except that norbornadiene was replaced with Compound (1) (having a structure represented by

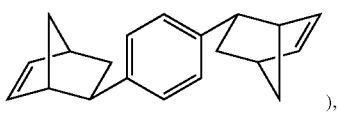 [SMILES: C1=CC2CC1CC2c1ccc(C2CC3C=CC2C3)cc1]), obtaining Oligomer (9). Next, the number average molecular weight (Mn) and the polydispersity index (PDI) of Oligomer (9) were determined, and the results are shown in Table 1.

Example 10

Example 10 was performed in the same manner as Example 1 except that norbornadiene was replaced with Compound (2) (having a structure represented by

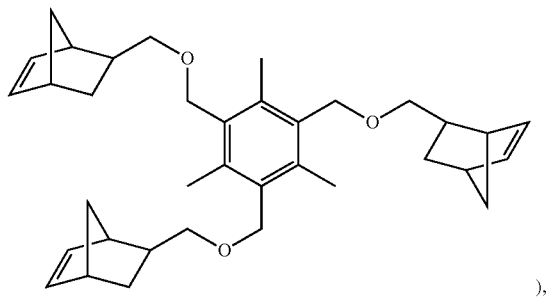 [SMILES: Cc1c(COCC2CC3C=CC2C3)c(C)c(COCC2CC3C=CC2C3)c(C)c1COCC1CC2C=CC1C2]), obtaining Oligomer (10). Next, the number average molecular weight (Mn) and the polydispersity index (PDI) of Oligomer (10) were determined, and the results are shown in Table 1.

Example 11

First, 3 g of Compound (3) (having a structure represented by

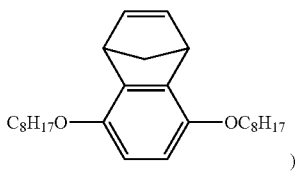)

(7.5 mmol), 9 g of vinyl norbornene(vinyl norbornene) (75 mmol), and 60 ml of dichloromethane ($CH_2Cl_2$) were mixed, obtaining a first solution. Next, 0.239 g of bis (propanenitrile) dichloropalladium (II), 0.119 ml of propanenitrile, and 180 ml of dichloromethane ($CH_2Cl_2$) were added into a reaction bottle under nitrogen atmosphere. After stirring, 0.567 g of silver hexafluoroantimonate ($AgSbF_6$) was added into the reaction bottle. Next, after stirring for 30 min, the first solution was added the reaction bottle. After stirring for 2 hr, 0.67 g of norbornadiene (7.27 mmol) was added into the reaction bottle. Next, after stirring for 24 hr, the result was purified, recrystalized, and filtered, and the precipitate was collected. After drying the precipitate at 60° C., the result was collected, obtaining Oligomer (11). Next, the number average molecular weight (Mn) and the polydispersity index (PDI) of Oligomer (11) were determined, and the results are shown in Table 1

Comparative Example 1

Comparative Example 1 was performed in the same manner as Example 11 except that norbornadiene was not added, obtaining Oligomer (12). Next, the number average molecular weight (Mn) and the polydispersity index (PDI) of Oligomer (12) were determined, and the results are shown in Table 1.

Comparative Example 2

First, 4.5 g of Compound (3) (having a structure represented by

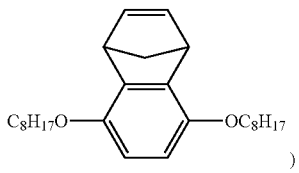)

(11.29 mmol) (serving as a reactant (c)), 2.7 g of Compound (4) (having a structure represented by

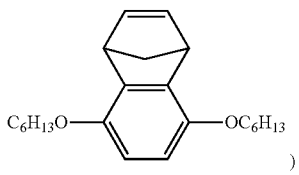)

(7.98 mmol) (serving as a reactant (c)), 4.5 g of norbornene (47.80 mmol) (serving as a reactant (c)), and 30 ml of dichloromethane ($CH_2Cl_2$) were mixed, obtaining a first solution. Next, 0.3 g of bis(propanenitrile) dichloropalladium 0.156 ml of propanenitrile, and 50 ml of dichloromethane ($CH_2Cl_2$) were added into a reaction bottle under nitrogen atmosphere. After stirring, 0.75 g of silver hexafluoroantimonate ($AgSbF_6$) was added into the reaction bottle. Next, after stirring for 30 min, the first solution was added into the reaction bottle. After stirring for 2 hr, 1.3 g of norbornadiene (14.11 mmol) (serving as a reactant (b)) was added into the reaction bottle. Next, after stirring for 24 hr, the result was purified, recrystalized, and filtered, and the precipitate was collected. After drying the precipitate at 60° C., the result was collected, obtaining Oligomer (13). Next, the number average molecular weight (Mn) and the polydispersity index (PDI) of Oligomer (13) were determined, and the results are shown in Table 1

Comparative Example 3

Comparative Example 3 was performed in the same manner as Comparative Example 2 except that norbornadiene was not added, obtaining Oligomer (14). Next, the number average molecular weight (Mn) and the polydispersity index (PDI) of Oligomer (14) were determined, and the results are shown in Table 1.

Comparative Example 4

Comparative Example 4 was performed in the same manner as Example 1 except that norbornadiene was not added, obtaining Oligomer (15). Next, the number average molecular weight (Mn) and the polydispersity index (PDI) of Oligomer (15) were determined, and the results are shown in Table 1.

TABLE 1

| | reactant (b) | reactant (c) | reactant (d) | weight ratio of reactant (c) to reactant (d) | weight ratio of reactant (c) to reactant (b) | number average molecular weight (Mn) | PDI |
|---|---|---|---|---|---|---|---|
| Example 1 | norbornadiene | norbornene | vinyl norbornene | 1:1 | 9:1 | 1953 | 1.78 |
| Example 2 | norbornadiene | norbornene | vinyl norbornene | 3:1 | 13.5:1 | 2197 | 1.93 |
| Example 3 | norbornadiene | norbornene | vinyl norbornene | 2:1 | 12:1 | 2171 | 2.08 |
| Example 4 | norbornadiene | norbornene | vinyl norbornene | 1:2 | 6:1 | 1285 | 1.58 |
| Example 5 | norbornadiene | norbornene | vinyl norbornene | 1:3 | 4.5:1 | 1262 | 1.62 |
| Example 6 | norbornadiene | norbornene | vinyl norbornene | 1:4 | 3.6:1 | 1253 | 1.60 |
| Example 7 | norbornadiene | norbornene | vinyl norbornene | 1:5 | 3:1 | 1239 | 1.59 |
| Example 8 | dicyclopentadiene | norbornene | vinyl norbornene | 1:1 | 9:1 | 1291 | 1.59 |
| Example 9 | compound (1) | norbornene | vinyl norbornene | 1:1 | 9:1 | 1654 | 1.84 |
| Example 10 | compound (2) | norbornene | vinyl norbornene | 1:1 | 9:1 | 1553 | 1.78 |
| Example 11 | norbornadiene | compound (3) | vinyl norbornene | 1:3 | 4.5:1 | 2190 | 1.91 |
| comparative example 1 | — | compound (3) | vinyl norbornene | 1:3 | — | 1310 | 1.54 |
| comparative example 2 | norbornadiene | compound (3)/ compound (4)/ norbornene | — | — | 6.9:1 | 6100 | 1.95 |
| comparative example 3 | — | compound (3)/ compound (4)/ norbornene | — | — | — | 4090 | 1.70 |
| comparative example 4 | — | norbornene | vinyl norbornene | 1:1 | — | 1783 | 1.78 |

Test of Solubility

The solubility of Oligomers (1)-(7) of Examples 1-7 in the solvent was measured. The method for determining the solubility included the following steps. The oligomer was added into solvent at room temperature, wherein the weight ratio of the oligomer to the solvent was 1:1. After stirring for 10 min, the weight percentage of the oligomer which was disposed in the solvent was determined, and the results are shown in Table 2.

TABLE 2

| | Example 1 | Example 2 | Example 3 | Example 4 | Example 5 | Example 6 | Example 7 |
|---|---|---|---|---|---|---|---|
| weight ratio of reactant (c) to reactant (d) | 1:1 | 3:1 | 2:1 | 1:2 | 1:3 | 1:4 | 1:5 |
| solubility (in dimethylformamide) (wt %) | >90 | >60 | >70 | >90 | >90 | >90 | >90 |
| solubility (in dichloromethane)(wt %) | >90 | >50 | >50 | >90 | >90 | >90 | >90 |
| Solubility (in xylene) (wt %) | >90 | >50 | >60 | >90 | >90 | >90 | >90 |
| Solubility (in toluene) (wt %) | >90 | >50 | >50 | >90 | >90 | >90 | >90 |

As shown in Table 2, all the oligomers of the Examples of the disclosure have great solubility in organic solvent. Furthermore, when the weight ratio of norbornene to vinyl norbornene is less than 1:1 (such as from 1:1 to 1:5), the obtained oligomer exhibits excellent solubility in organic solvent, thereby enhancing the processability of the oligomer.

Properties Measurement of Composition and Cured Product Thereof

Example 12

Oligomer (1) (50 parts by weight) of Example 1 and styrene butadiene copolymer resin (manufactured by Sartomer with a trade No. of Ricon 100 (with a molecular weight of about 4,500) (50 parts by weight) were added into a reaction bottle, and then dissolved in toluene (60 parts by weight) serving as a solvent. After mixing completely, 3,5-tri-2-propenyl-1,3,5-triazine-2,4,6(1H,3H,5H)-trione (TAIC) (40 parts by weight) and initiator (1,3-bis[3-(tert-butylperoxy)propyl]benzene, sold and manufactured by NOF Corporation with a trade No. of Perbutyl P) (6 parts by weight) were added into the reaction bottle, obtaining a composition. Next, the aforementioned composition was coated on a copper foil (manufactured and sold by Furukawa Circuit Foil Co., Ltd.) by blade coating (with a blade having a thickness of 300 μm) (the rotation speed of the spinner was 300 rpm). Next, the copper foil coated with the composition was heated at 90° C. for 30 min under nitrogen atmosphere. Next, the above the copper foil was then heated at 160° C. for 10 min. Next, the above the copper foil was then heated at 210° C. for 2 hr under nitrogen atmosphere, and then heated at 250° C. for 4 hr. Finally, the copper foil was removed and the obtained cured product was cut, obtaining Substrate (1) (3 mm×8 cm).

The dielectric constant (Dk) and the dissipation factor (Df) of Substrate (1) were measured at 10 GHz by microwave dielectrometer (sold by AET company), and the results are shown in Table 3.

Comparative Example 5

Comparative Example 5 was performed in the same manner as Example 12 except that Oligomer (1) of Example 1 was replaced with Oligomer (15) of Comparative Example 4, obtaining Substrate (2). Next, the dielectric constant (Dk) and the dissipation factor (Df) of Substrate (2) were measured at 10 GHz by microwave dielectrometer (sold by AET company), and the results are shown in Table 3.

TABLE 3

|  | oligomer | dielectric constant (10 GHz) | dissipation factor (10 GHz) |
| --- | --- | --- | --- |
| Example 12 | oligomer (1) | 2.35 | 0.0011 |
| comparative example 5 | oligomer (15) | 2.40 | 0.0018 |

Since norbornadiene was added to react with Oligomer (1) of Example 1 to undergo an addition polymerization, Oligomer (1) has a branched structure. In comparison with linear oligomer (such as Oligomer (15)), Oligomer (1) having a branched structure exhibits a relatively low crystallinity. Therefore, the molecular weight of Oligomer (1) is easily controlled and Oligomer (1) exhibits superior solubility and processability. As shown in Table 3, in comparison with Substrate (2) of Comparative Example 5 prepared by linear Oligomer (15), Substrate (1) exhibits a relatively low dielectric constant and a relatively low dissipation factor, since Substrate (1) of Example 12 was prepared from Oligomer (1) having the branched structure.

The oligomers of Examples of the disclosure have a branched structure and have a branching ratio larger than 50%, due to the addition of the reactant (b) for undergoing a polymerization.

Example 13

Example 13 was performed in the same manner as Example 12 except that Oligomer (1) of Example 1 was replaced with Oligomer (8) of Example 8, obtaining Substrate (3). Next, the dielectric constant (Dk) and the dissipation factor (Df) of Substrate (3) were measured at 10 GHz by microwave dielectrometer (sold by AET company), and the results are shown in Table 4.

Example 14

Example 14 was performed in the same manner as Example 12 except that Oligomer (1) of Example 1 was replaced with Oligomer (9) of Example 9, obtaining Substrate (4). Next, the dielectric constant (Dk) and the dissipation factor (Df) of Substrate (4) were measured at 10 GHz by microwave dielectrometer (sold by AET company), and the results are shown in Table 4.

TABLE 4

|  | oligomer | dielectric constant (10 GHz) | dissipation factor (10 GHz) |
| --- | --- | --- | --- |
| Example 12 | oligomer (1) | 2.35 | 0.0011 |
| Example 13 | oligomer (8) | 2.37 | 0.0012 |
| Example 14 | oligomer (9) | 2.38 | 0.0017 |

As shown in Table 4, the substrates prepared from Oligomers (8)-(9) exhibits a relatively low dielectric constant and a relatively low dissipation factor, since Oligomers (8)-(9) have the branched structure similar to that Oligomer (1).

Example 15

Example 15 was performed in the same manner as Example 12 except that Oligomer (1) of Example 1 was replaced with Oligomer (4) of Example 4, obtaining Substrate (5). Next, the dielectric constant (Dk) and the dissipation factor (Df) of Substrate (5) were measured at 10 GHz by microwave dielectrometer (sold by AET company), and the results are shown in Table 5.

Example 16

Example 16 was performed in the same manner as Example 12 except that Oligomer (1) of Example 1 was replaced with Oligomer (5) of Example 5, obtaining Substrate (6). Next, the dielectric constant (Dk) and the dissipation factor (Df) of Substrate (6) were measured at 10 GHz by microwave dielectrometer (sold by AET company), and the results are shown in Table 5.

Example 17

Example 17 was performed in the same manner as Example 12 except that Oligomer (1) of Example 1 was replaced with Oligomer (6) of Example 6, obtaining Substrate (7). Next, the dielectric constant (Dk) and the dissipation factor (Df) of Substrate (7) were measured at 10 GHz by microwave dielectrometer (sold by AET company), and the results are shown in Table 5.

Comparative Example 6

Comparative Example 6 was performed in the same manner as Example 12 except that Oligomer (1) of Example 1 was replaced with Oligomer (12) of Comparative Example 1, obtaining Substrate (8). Next, the dielectric constant (Dk) and the dissipation factor (Df) of Substrate (8) were measured at 10 GHz by microwave dielectrometer (sold by AET company), and the results are shown in Table 5.

Comparative Example 7

Comparative Example 7 was performed in the same manner as Example 12 except that Oligomer (1) of Example 1 was replaced with Oligomer (13) of Comparative Example 2, obtaining Substrate (9). Next, the dielectric constant (Dk) and the dissipation factor (Df) of Substrate (9) were measured at 10 GHz by microwave dielectrometer (sold by AET company), and the results are shown in Table 5.

Comparative Example 8

Comparative Example 8 was performed in the same manner as Example 12 except that Oligomer (1) of Example 1 was replaced with Oligomer (14) of Comparative Example 3, obtaining Substrate (10). Next, the dielectric constant (Dk) and the dissipation factor (Df) of Substrate (10) were measured at 10 GHz by microwave dielectrometer (sold by AET company), and the results are shown in Table 5.

TABLE 5

| | oligomer | dielectric constant (10 GHz) | dissipation factor (10 GHz) |
|---|---|---|---|
| Example 15 | oligomer (4) | 2.44 | 0.0017 |
| Example 16 | oligomer (5) | 2.28 | 0.0018 |
| Example 17 | oligomer (6) | 2.37 | 0.0018 |
| comparative example 6 | oligomer (12) | 2.42 | 0.0028 |
| comparative example 7 | oligomer (13) | 2.45 | 0.0038 |
| comparative example 8 | oligomer (14) | 2.30 | 0.0044 |

As shown in Table 5, the substrates prepared from the compositions (including the oligomers of the disclosure having the branched structure) exhibits a relatively low dielectric constant and a relatively low dissipation factor.

As shown in Table 3-5, since the composition including the oligomer of the disclosure, the cured product exhibits a relatively low dielectric constant (less than or equal to 2.5 (at 10 GHz) and a relatively low dissipation factor (less than or equal to 0.0020 (at 10 GHz)), so that oligomer can serve as ideal materials for a high frequency substrate.

It will be clear that various modifications and variations can be made to the disclosed methods and materials. It is intended that the specification and examples be considered as exemplary only, with the true scope of the disclosure being indicated by the following claims and their equivalents.

What is claimed is:

1. An oligomer, which is a reaction product of a reactant (a) and a reactant (b), wherein the oligomer has a number average molecular weight from 1,000 to 10,000; the reactant (a) is a reaction product or a reactant (c) and a reactant (d), wherein the reactant (c) and reactant (d) are reacted to form reactant (a) prior to the addition of any portion of reactant (b); the reactant (b) is a compound having a structure represented by Formula (I), a compound having a structure represented by Formula (II), a compound having a structure represented by Formula (III), a compound having a structure represented by Formula (IV), or a combination thereof or the reactant (b) is

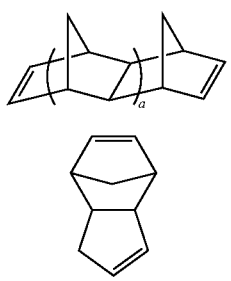

Formula (I)

Formula (II)

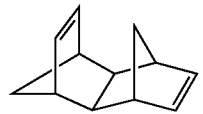

Formula (III)

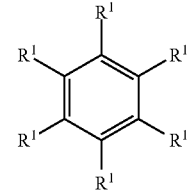

Formula (IV)

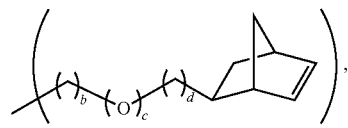

wherein, a is 0 or 1, and $R^1$ is independently hydrogen or

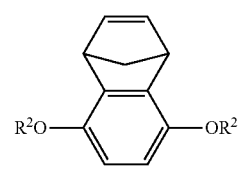

wherein b is 0 or an integer from 1 to 6; c is 0 or 1; d is 0 or an integer from 1 to 6, and at least one of $R^1$ is not hydrogen; the reactant (c) is a compound having a structure represented by Formula (V), compound having a structure represented by Formula (VI), or a combination thereof Formula (V)

Formula (VI)

wherein $R^2$ is independently $C_{5-10}$ alkyl group, and the reactant (d) is a compound having a structure represented by Formula (VII)

Formula (VII)

wherein e is 0 or an integer from 1 to 10.

2. The oligomer as claimed in claim 1, wherein the weight ratio of the reactant (c) to the reactant (d) is from 1:10 to 10:1.

3. The oligomer as claimed in claim 1, wherein the weight ratio of the reactant (c) to the reactant (d) is from 1:10 to 1:1.

4. The oligomer as claimed in claim 1, wherein the weight ratio of the reactant (c) to the reactant (b) is from 1:1 to 20:1.

5. The oligomer as claimed in claim 1, wherein the weight ratio of the reactant (c) to the reactant (b) is from 1:1 to 10:1.

6. The oligomer as claimed in claim 1, wherein the reactant (b) is

7. The oligomer as claimed in claim 1, wherein the reactant (b) is

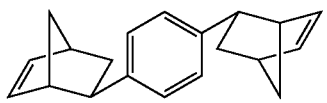

8. The oligomer as claimed in claim 1, wherein the reactant (b) is

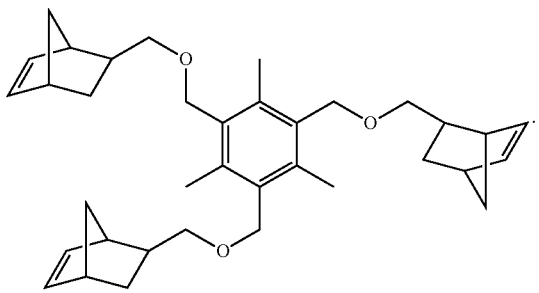 [SMILES: Cc1c(COCC2CC3C=CC2C3)c(C)c(COCC2CC3C=CC2C3)c(C)c1COCC1CC2C=CC1C2]

9. The oligomer as claimed in claim 1, wherein the reactant (c) is

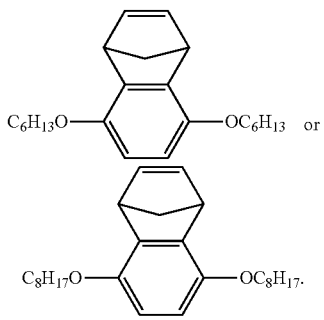

10. The oligomer as claimed in claim 1, wherein the reactant (d) is

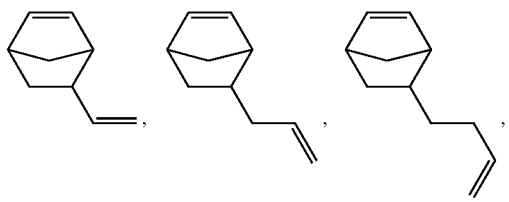

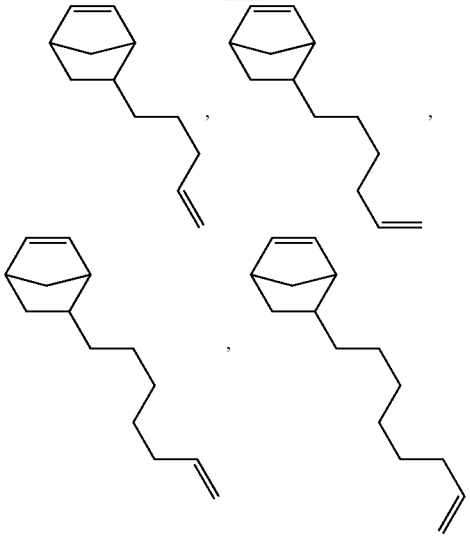

or a combination thereof.

11. A composition, comprising:
  100 parts by weight of the oligomer as claimed in claim 1; and
  20-110 parts by weight of crosslinking agent.

12. The composition as claimed in claim 11, wherein the crosslinking agent is ethylene glycol dimethacrylate (EGDMA), 1,4-butanediol diacrylate, triallyl cyanurate, triallyl isocyanurate (TAIC), trimethallyl isocyanurate (TMAIC), butyl acrylate, 2-hydroxyethyl acrylate, diallyl phthalate, diallyl isophthalate, diallyl terephthalate, hydroxypropyl acrylate, 2-hydroxyethyl methacrylate, hydrolyzed polymaleic anhydride, 1,2,4-triallyl trimellitate, divinylbenzene, or a combination thereof.

13. The composition as claimed in claim 11, further comprising:
  1-200 parts by weight of a resin.

14. The composition as claimed in claim 13, wherein the resin is epoxy resin, cyanate resin, phenol resin, novolac resin, polystyrene resin, styrene-butadiene copolymer resin, polyamide resin, polyimide resin, maleimide, bismaleimide, polyphenylene ether resin, or a combination thereof.

15. The composition as claimed in claim 11, further comprising:
  1-30 parts by weight of an additive.

16. The composition as claimed in claim 15, wherein the additive is initiator, hardener, leveling agent, filler, colorant, defoamer, flame retardant, or a combination thereof.

17. A composite material, comprising:
  a cured product or a semi-cured product prepared by the composition as claimed in claim 11; and a substrate, wherein the cured product or the semi-cured product is disposed on the substrate or disposed within the substrate.

18. The composite material as claimed in claim 17, wherein the substrate is glass fiber, or copper foil.

19. The composite material as claimed in claim 17, wherein the composite material is copper foil substrate, or a printed circuit board.

* * * * *